United States Patent
McGuinness (10) Patent No.: US 8,522,183 B1
(45) Date of Patent: Aug. 27, 2013

(54) STATIC TIMING ANALYSIS ADJUSTMENTS FOR AGING EFFECTS

(75) Inventor: Patrick J. McGuinness, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/539,394

(22) Filed: Jun. 30, 2012

(51) Int. Cl.
G06F 17/50 (2006.01)

(52) U.S. Cl.
USPC .......................................... 716/113; 716/136

(58) Field of Classification Search
USPC ................................................. 716/113, 136
See application file for complete search history.

(56) References Cited

U.S. PATENT DOCUMENTS

| | | | |
|---|---|---|---|
| 5,878,053 A | 3/1999 | Koh et al. | |
| 6,114,181 A | 9/2000 | Gregoritsch, Jr. | |
| 6,541,285 B2 | 4/2003 | Koike | |
| 7,268,575 B1 | 9/2007 | Chen et al. | |
| 7,292,968 B2 | 11/2007 | Wu et al. | |
| 7,707,525 B2 | 4/2010 | Varon-Weinryb | |
| 7,835,890 B2 | 11/2010 | Wu et al. | |
| 7,975,252 B2 | 7/2011 | Varon-Weinryb | |
| 8,407,025 B2* | 3/2013 | Blaauw et al. | 702/179 |
| 2001/0029600 A1* | 10/2001 | Lee et al. | 716/17 |
| 2002/0008252 A1 | 1/2002 | Koike | |
| 2003/0055621 A1 | 3/2003 | Wu et al. | |
| 2003/0189465 A1 | 10/2003 | Abadeer et al. | |
| 2005/0065765 A1 | 3/2005 | Visweswariah | |
| 2008/0027699 A1 | 1/2008 | Wu et al. | |
| 2008/0071511 A1 | 3/2008 | Lin | |
| 2008/0275672 A1 | 11/2008 | Varon-Weinryb | |
| 2009/0013294 A1 | 1/2009 | Visweswariah | |
| 2009/0241080 A1* | 9/2009 | Yang et al. | 716/6 |
| 2010/0204972 A1 | 8/2010 | Hsu et al. | |
| 2010/0286975 A1 | 11/2010 | Varon-Weinryb | |
| 2010/0318951 A1 | 12/2010 | Foreman et al. | |
| 2011/0035714 A1 | 2/2011 | Foreman et al. | |

OTHER PUBLICATIONS

Chakraborty, Ashutosh et al., Skew Management of NBTI Impacted Gated Clock Trees, ISPD '10, Mar. 14-17, 2010, San Francisco, CA., 7 pages.
Lu, Yinghai et al., Statistical Reliability Analysis Under Process Variation and Aging Effects, DAC '09, Jul. 26-31, 2009, San Francisco, CA, pp. 514-519.
Bild, David R. et al., Minimization of NBTI Performance Degradation Using Internal Node Control, Design, Automation & Test in Europe Conference & Exhibition, Apr. 20-24, 2009, pp. 148-153.

* cited by examiner

*Primary Examiner* — Vuthe Siek
*Assistant Examiner* — Mohammed Alam
(74) *Attorney, Agent, or Firm* — Jackson Walker L.L.P.

(57) ABSTRACT

A method for incorporating aging effects into the static timing analysis of a design of an integrated circuit includes determining aging factors for the arc-state pairs of standard cells. The aging factors may include nominal aging factors and variational aging factors reflecting on chip variation aging effects. State profiles are determined for each cell instance in the design. The state profile for a cell instance indicates probabilities for each possible state that the cell may occupy. Based on the instance-specific state profiles and the aging factors, instance-specific aging factors are derived. The instance-specific aging factors may then be converted into instance-specific aging effect timing values. The instance-specific aging effect timing values may then be used to generate instance-specific static timing models, which may be used to perform static timing analysis.

19 Claims, 4 Drawing Sheets

STATIC TIMING ANALYSIS ADJUSTMENTS FOR AGING EFFECTS

BACKGROUND

1. Field

Disclosed subject matter is in the field of integrated circuit design and, more particularly, the verification of an integrated circuit design using static timing analysis.

2. Related Art

In the design of integrated circuits, static timing analysis is performed to achieve a comparatively accurate and relatively quick assessment of a design's timing. In static timing analysis, timing characteristics assigned to standard cells are used to verify the design and identify critical timing paths. The characteristics and performance of a standard cell may, however, vary over time. These time dependent variations may be referred to generally as aging effects.

Known aging effects include, as examples, negative bias temperature instability (NBTI), positive bias temperature instability (PBTI), and hot carrier injection (HCI) effects. NBTI produces damage to PMOS transistors and shifts PMOS threshold voltage upward. The extent of NBTI is influenced by voltage, temperature, and the state profile of the applicable PMOS device, where the state profile refers to the percentage of clock cycles a design spends in any given state. PBTI impacts NMOS transistors and, although not as significant as NBTI historically, may become more pronounced with advancing technology. HCI effects refer to damage from high switching current and depend on voltage and steady state current drive as well as the amount of switching that occurs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Historically, static timing analysis has either ignored aging effects entirely or accounted for them in an overly simplistic or overly conservative manner. Static timing analysis subject matter disclosed herein employs state/activity profiles for each cell instance within a design to make instance-specific adjustments to static timing analysis timing models to account for aging effects in a manner that is practical even for full system-on-chip (SoC) level timing and includes on chip variation (OCV) adjustments. Instance-specific aging factors are determined and then converted to instance-specific timing adjustments through non-linear interpolation from aged timing library information to obtain more accurate aging effect timing adjustments.

In one aspect, a disclosed method for performing static timing analysis of a design of an integrated circuit includes determining aging factors for all or substantially all arc-state pairs of all or substantially all standard cells in a standard cell library. The aging factors may include nominal aging factors and variational aging factors reflecting OCV aging effects.

Cell state profiles, referred to herein simply as state profiles, may be determined for each cell instance in the design where a cell instance represents an instantiation of a standard cell within the design. The state profile for a cell instance indicates instance-specific probabilities for possible states that the cell may occupy. Based on the instance-specific state profiles and the aging factors, instance-specific aging factors may be derived for each of the cell instances. Like the aging factors, the instance-specific aging factors may include nominal and variational aging factors.

The instance-specific aging factors may then be converted into instance-specific aging effect timing values. The instance-specific aging effect timing values may then be used to generate instance-specific static timing models, which may be used to perform static timing analysis. If the static timing analysis raises an exception or otherwise fails, the design may be modified. When no exception is raised, disclosed methods may include manufacturing a semiconductor device based on the database.

Determining state profiles for each of the cell instances may include performing a simulation of the device to generate simulation output indicating state profile data, i.e., data indicating which cell states a cell occupied during the simulation. The profile data may indicate a cell state for each clock cycle simulated. In other embodiments, the state profile data may be in the form of cumulative information indicating relative percentages of clock cycles associated with each state a cell might occupy. Determining the instance-specific aging factors may include weighting the aging factors based on state probabilities indicated by the state profiles.

The aging factors may be determined or estimated by simulating or characterizing transistor level models of each standard cell. These aging factor estimates may be modified by explicitly derived information.

Converting the instance-specific aging factors into instance-specific aging effect timing values may include interpolating at least one instance-specific aging effect timing value from a predetermined aging effect timing value. The interpolation may be a non-linear interpolation.

As used herein, the term "cell" refers to a pre-defined functional block or other discrete design element that is available to designers for inclusion as a functional element within a design. A "standard cell library" refers to a database containing a finite, but potentially significant number of pre-defined cells often generated in conjunction with a particular process technology. The term "cell type" refers to a class of cells, such as 2-input NAND gates for example, that share the same number of inputs, the same number of outputs, and the same functionality. A cell type may encompass cells of differing sizes and/or drive current. For example, the 2-input NAND gate cell type may include a first 2-input NAND gate cell having a large drive current and a second 2-input NAND gate cell having a smaller drive current and footprint. A "cell instance" refers to a specific cell that has been included within a design. A design may, for example, include seven instances of the first 2-input NAND gate cell referred to above. The terms "arc" and "cell arc" are substantially synonymous as used herein and refer to a path from a specified input of a cell to a specified output of the cell. An arc may be characterized by a time value such as a propagation delay indicating an amount of time required for a transition at the input of the arc to produce a transition at the output of the arc. Arc timing may exhibit a dependence on the "state" of the cell. A cell state refers to one of a finite number of stable combinations of inputs and outputs that the cell may exhibit. The 2-input NAND gate, for example, has four states corresponding to the four possible combinations of its inputs. For purposes of static timing analysis, a cell may be characterized in terms of its arc-state pairs where an arc-state pair refers to a specified arc during a specified state of the cell. The 2-input NAND gate, for example, has two arcs and four states for a combination of eight arc-state pairs.

Figure 1:
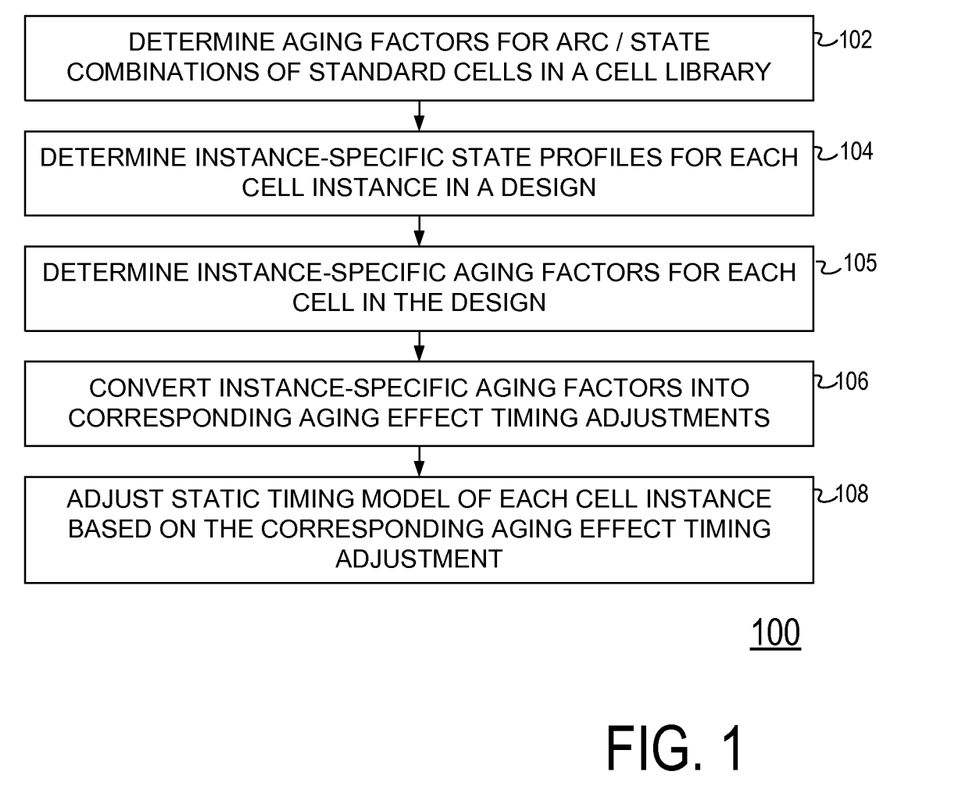
FIG. 1 is a flow diagram of selected elements of an embodiment of a method of performing static timing analysis.

Turning now to the drawings, FIG. 1 depicts selected elements of an embodiment of a method 100 for incorporating aging effect adjustments into the static timing analysis timing models for the cells in a given design. In the depicted embodiment, method 100 includes determining (block 102) aging factors for each arc-state pair in a standard cell library. The determination of aging factors as depicted in block 102 may include, for example, accessing one or more libraries of aging factor data and deriving aging factors based on the aging factor data. Aging factor data may be generated for each arc-state combination in a standard cell library by simulating transistor level models of each standard cell in the standard cell library using transistor level simulation models (e.g., SPICE).

Alternatively, a baseline of aging factor data for each arc-state might be developed or refined empirically by fabricating sufficient instances of each cell type to accommodate all of the possible states associated with a cell. A test apparatus could then be programmed to bias the instances of each cell type to enumerate all of the possible states. Timing effect data could then be generated and recorded by periodically testing or measuring various parameters indicative of aging effects over a relatively extended period of time. Temperature, voltage, and other environmental factors might be controlled to accelerate aging effects.

Aging effects are inherently time varying, but it will be appreciated that it is not generally feasible to determine aging factors as a continuous function of time from time 0 to end of life for each arc-state combination in a potentially large standard cell library. In some implementations of incorporating aging effect modifications into a static timing analysis, aging factor data libraries might be developed for a set of discrete time values. For example, an aging factor database may include a first aging factor library containing "early life" aging factor data, a second aging factor library containing "mid-life" aging factor data, and a third aging factor library containing "mature" aging factor data. It will be appreciated that the number of aging factor libraries is an implementation detail. Similarly, the specific amount of time that demarcates early life, mid-life, and maturity may vary from implementation to implementation and may be influenced by factors including the design under consideration, the process technology, and other factors. When a discrete number of aging factor libraries are employed, aging factors for other time points may be estimated using, for example, interpolation techniques.

Aging factors for each arc-state may be estimated based on aging factor data in the aging factor data libraries using a power law model of timing degradation. A power law model may provide a timing degradation estimate as a function of one or more variables. In one implementation, a power law model estimates timing degradation for an arc-state as a function of time, temperature, and the duty cycle of the arc-state, where the duty cycle of an arc-state may indicate the percentage of time an arc-state spends in a "stressed" state. For a given duty cycle and temperature, the power law model may estimate timing degradation as:

$$\text{Delta} = kt^n \qquad \text{[EQUATION1]}$$

where Delta represents the aging effect degradation and k and n are constants referred to herein as aging factor constants. Each aging factor data library corresponds to a specific value of time (t) and indicates the value of Delta for a known or simulated value of temperature and duty cycle. The aging factor data libraries may, therefore, be used to estimate aging factors for each arc-state by estimating values for the aging factor constants. For an example using three aging factor data libraries, three different equations indicating a value of Delta in terms of k, n, and a corresponding t can be stated. From these three equations, an estimate of the aging factor constants may be determined according to any of various techniques.

The determination of aging factors in block 102 may be performed independent of the determination of instance-specific state profiles described below with respect to block 104. For example, it may be sufficient to determine aging factor libraries for each arc-state pair in a standard cell library just once. Thereafter, these aging factor libraries may be consulted to determine static timing analysis aging effect adjustments for each design that utilizes the standard cell library.

The embodiment of method 100 depicted in FIG. 1 further includes the determination (block 104) of state profiles for each instance of a cell in a given design. The instance-specific state profiles determined in block 104 may indicate, for example, the percentage of clock cycles that a cell instance spends in any given cell state. A first instance of a particular cell may, for example, spend 90% of its operational life in a particular cell state while a second instance of the same cell within the same design may spend roughly equal percentages of clock cycles in each of the states that the cell may assume. Method 100 as depicted in FIG. 1 recognizes and accommodates a relationship between aging effects and state profiles. For example, recognizing that some cell states produce more aging effects than other cell states, the determination of state profiles in block 104 provides quantitative and instance-specific information regarding the percentage of clock cycles a cell instance spends in a particular state.

It will be appreciated by those of skill that the exact state profile of a cell instance is a function of the operations that the design performs and the inputs that are provided to the design. While the exact sequence of inputs and operations that a design may perform is not knowable, a simulation of the operation of the design may produce state profile information that closely conforms to the actual state profile that the design produces in operation. Thus, determining state profiles in block 104 may include simulating operation of the design and generating a simulation output that includes information sufficient to approximate state profile information for each cell instance within the design. However, for designs of any significant complexity including, as examples, SoC designs, a complete functional simulation may not be feasible because of the amount of time required to simulate the operation of a complex design. When a full functional simulation of a design is not feasible, the methods for incorporating aging effect adjustments into static timing analysis described herein may obtain state profile information from which state profiles may be generated using a comparatively short set of simulation test vectors. By generating state profile information from a relatively short set of simulation vectors, method 100 supports the use of instance-specific aging effect adjustments without incurring the expense and time of performing full functional simulation of a design.

After the arc-state aging factors and instance-specific state profiles have been determined in blocks 102 and 104 respectively, the depicted embodiment of method 100 includes determining (block 105) instance-specific aging factors for each arc instantiated in the design. In some embodiments, the determination of instance-specific aging factors includes determining a weighted average of a cell's aging factors, where the weighting is based on the instance-specific state profile information determined in block 104. For example, if state profile information for a specific instance of a 2-input NOR gate cell reveals that this instance of the cell is in operational state 1 for approximately 60% of clock cycles, operational state 2 for 10% of clock cycles, operational state 3 for 15% of clock cycles, and operational state 4 for 15% of clock cycles, then the instance-specific aging factor for each arc of this instance of the cell may be calculated or otherwise generated by multiplying the arc's aging factor for state 1, which was determined in block 102, by 60%, multiplying the arc's aging factor for state 2 by 10%, multiplying the arc's aging factor for state 3 by 15%, multiplying the arc's aging factor for state 4 by 15%, and summing all four of the resulting products to obtain an aging factor that is based on a state profile that reflects the operation of this cell instance.

Method 100 as depicted in FIG. 1 further includes converting (block 106) cell instance-specific aging factors into adjusted timing values for use in conjunction with a static timing analysis. Depending upon the implementation, the conversion of instance-specific aging factors into adjusted timing values may include nonlinear interpolation of data in the aging factor database for the applicable standard cell library. One approach to converting aging factors into adjusted timing values is described with respect to the graph depicted in FIG. 2.

Figure 2:
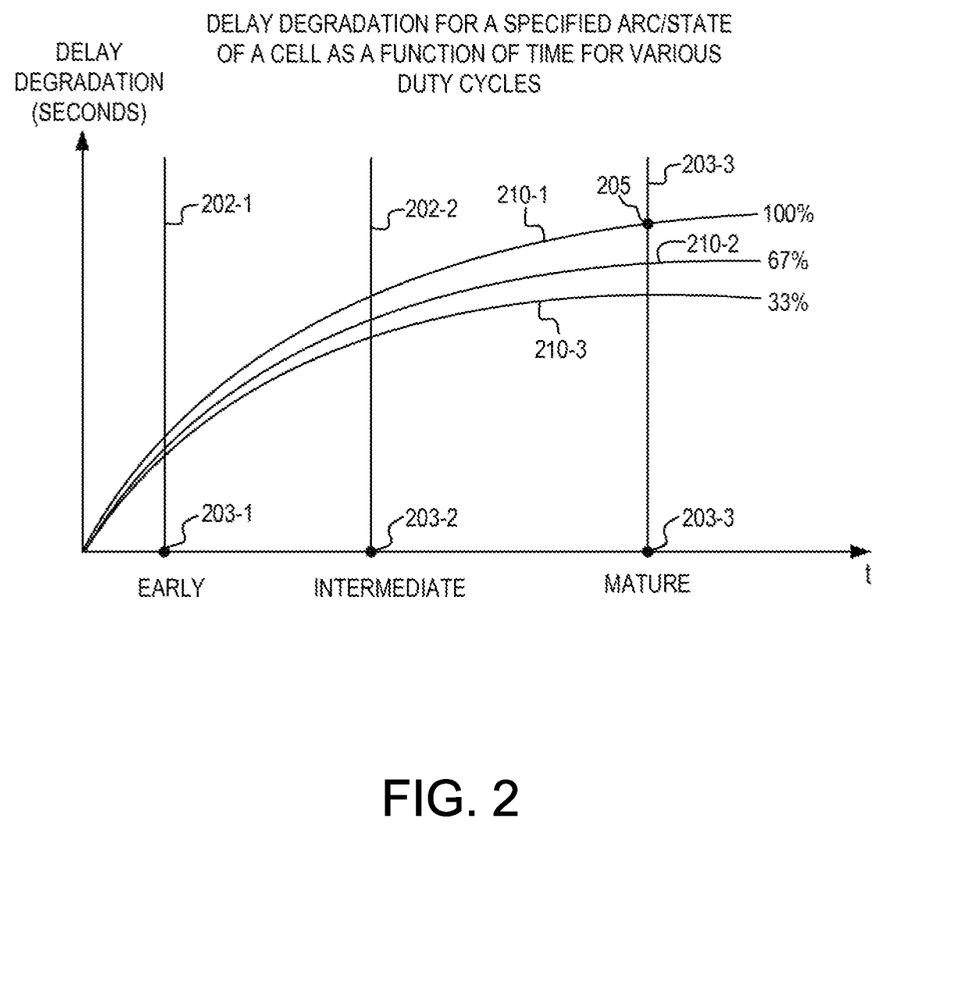
FIG. 2 is a graph illustrating delay degradation for a standard cell arc as a function of time for different values of duty cycles.

FIG. 2 depicts a graph 200 illustrating delay degradation as a function of time for a specified arc-state of a cell. The aging factor libraries referred to in the preceding discussion of FIG. 1 may include information from which delay degradation values may be determined or estimated. The x-axis of graph 200 represents the independent variable time. Graph 200 as depicted in FIG. 2 includes three boundary lines 202-1 through 202-3 oriented perpendicular to the x-axis and intersecting the x-axis at three boundary points 203-1 through 203-3 of independent variable t. The three values of time emphasized by lines 202 include a first time point 203-1, identified as "Early," a second time point 203-2, identified as "Mid-life" and a third time point 203-3, identified as "Mature." As suggested previously, some embodiments may develop or maintain aging factor libraries for each of three or more values of a time. In the embodiments described herein, the three time points 203 roughly demarcate three stages in the lifetime of a cell. The exact values of times assigned to each of the three time points 203 may vary among any of multiple implementations of the database. In some embodiments, the three lines 202 and corresponding time points 203 represent the time values associated with the three aging factor libraries in the aging factor database.

As discussed previously, transistor level simulation may provide aging factor data than can be used to determine, derive, or otherwise acquire aging factors. As depicted in FIG. 2, graph 200 includes three lines, 210-1 through 210-3, each representing delay degradation as a function of time for a specified duty cycle. In FIG. 2, for example, first line 210-1 indicates delay degradation for the arc-state assuming a 100% duty cycle, second line 210-2 indicates delay degradation for the arc-state assuming a 67% duty cycle, and third line 210-3 indicates delay degradation for the arc-state assuming a 33% duty cycle.

It should be noted that the 67% associated with second line 210-2 and the 33% associated with third line 210-3 merely indicate a duty cycle criteria and do not necessarily mandate a linear relationship with the first line 210-1. Thus, for example, while the delay degradation for second line 210-2 at any given point in time may be approximately 67% of the corresponding delay degradation for first line 210-1, the two lines may have a non-linear relationship such that the delay degradation on second line 210-2 is greater than or less than 67% of the corresponding delay degradation on line 210-1.

Graph 200 as depicted in FIG. 2 includes a data point, referred to herein as worst case aging factor 205, positioned on or in the vicinity of the intersection of the 100% duty cycle line 210-1 and the line 202-3 corresponding to mature time point 202-3. Data point 205 indicates a worst case delay degradation for the applicable arc-state, i.e., the delay degradation corresponding to steady state biasing of the applicable arc in its stressed condition for a duration approximating the lifetime of the cell. While conventional static timing analysis might use this worst case delay degradation to account for aging effects or disregard aging effects entirely, the techniques described herein determine an aging factor based on the cell's state profile to relax or "de-rate" the worst case aging factor.

Graph 200 suggests that the aging factor for a specific instance of an arc may be de-rated from the worst case delay degradation via two distinct mechanisms. First, as stated previously, the aging factor applied to a particular instance of an arc may be reduced from the 100% aging factor when the particular instance of the arc exhibits a state profile in which the arc occupies states that are less stressful in terms of aging effect parameters. This profile-based relaxation of the aging factor is represented by second line 210-2 and third line 210-3. In addition, because worst case aging factor 205 is associated with a large value of the independent variable t, i.e., worst case aging factor 205 corresponds to the mature time point 203-3, the aging factor employed in static timing analysis may be relaxed by effectively relaxing the assumed value of t. The three lines 210 indicated in graph 200 may be estimated by first estimating the aging factor constants and then employing the power law model for various values of duty cycle and time.

Returning now to FIG. 1, the depicted embodiment of method 100 includes adjusting (block 108) a static timing model of a cell instance based on the applicable aging effect determined in block 106. The static timing model itself may include no age adjustment information or may include aging effect information that is not specific to the particular design and does not include aging effect adjustments that are specific to each instance of a cell within the design based on each cell instance's state profile. Moreover, the assumed static timing model of a cell may include static timing analysis adjustments for factors that are different than the aging effect factors described herein. For example, the static timing models may include adjustments for static timing based on the location of a device within a wafer during fabrication and other static timing model analysis adjustments that may be included.

Regardless of the information that is included within a static timing model, block 108 as depicted in FIG. 1 encompasses the concept of adjusting the static timing model based upon aging effect timing adjustments that are specific to each instance of a cell within a design. The use of aging effect adjusted timing information that is specific to instances of a cell within a design beneficially improves the accuracy of the timing adjustments. Instance-specific aging effect adjustments may, for example, beneficially reduce the amount of static timing adjustment required for aging effect considerations by recognizing that a certain cells within a particular design spend a relatively small portion of their functional lifetime in states that are worst-case for aging effect degradation. If, for example, a particular standard cell exhibits aging effect degradation that is strongly dependent upon the cell's state and the cell instance implemented within a particular design spends comparatively little time in the worst case state, instance-specific aging effect timing adjustments may reduce the amount of aging effect adjustments required. Smaller aging effect adjustments reduce the probability that any given design will raise an exception during static timing analysis.

Conversely, if the state profile information obtained in block 104 reveals that the cell instances within a particular design are stressed in a manner that is worst-case for aging effect degradation, instance-specific aging effect adjustments may beneficially increase the amount of aging effect adjustments employed during static timing analysis while a conventional approach to performing static timing analysis may underestimate the amount of aging effect degradation that the design is likely to experience or exhibit.

After static timing models have been adjusted to account for aging effects as described above, a static timing analysis of a design using the adjusted static timing may be performed. If the aging effect adjusted static timing analysis generates any exceptions, the design may be modified and a static timing analysis of the modified design, either with or without further aging effect timing adjustments, may be performed. This sequence may be repeated one or more times until a static timing analysis generates no exceptions. After a static timing analysis generating no exceptions is performed, the design may receive static timing analysis approval and be released to the next stage in the design process, which may a functional verification by simulating the operation of the design using test vectors.

In some embodiments, method 100 may include blocks (not depicted) for performing instance-specific adjusting of OCV timing models for static timing analysis based on instance-specific state profile information. In these embodiments, the state profile information described above may be leveraged for OCV timing adjustment. OCV aging factor values are then determined or derived for each arc-state in the design and instance-specific aging factors are calculated using the state profiles and the OCV aging factors. The OCV aging factors are converted to OCV timing adjustments and incorporated into the static timing analysis modules. OCV timing adjustments based on state profile data beneficially improve the static timing analysis because data suggests that aging impacts variability to a significant degree.

Similarly, method 100 may include blocks (not depicted) for performing state-influenced HCI timing adjustments to the static timing analysis timing models. Analogous to the blocks depicted in FIG. 1, the blocks for HCI timing adjustments incorporates cell activity information into the state profile and the arc-state aging factors, the instance-specific aging factors, and the instance-specific timing adjustments are influenced by the activity data.

Figure 3:
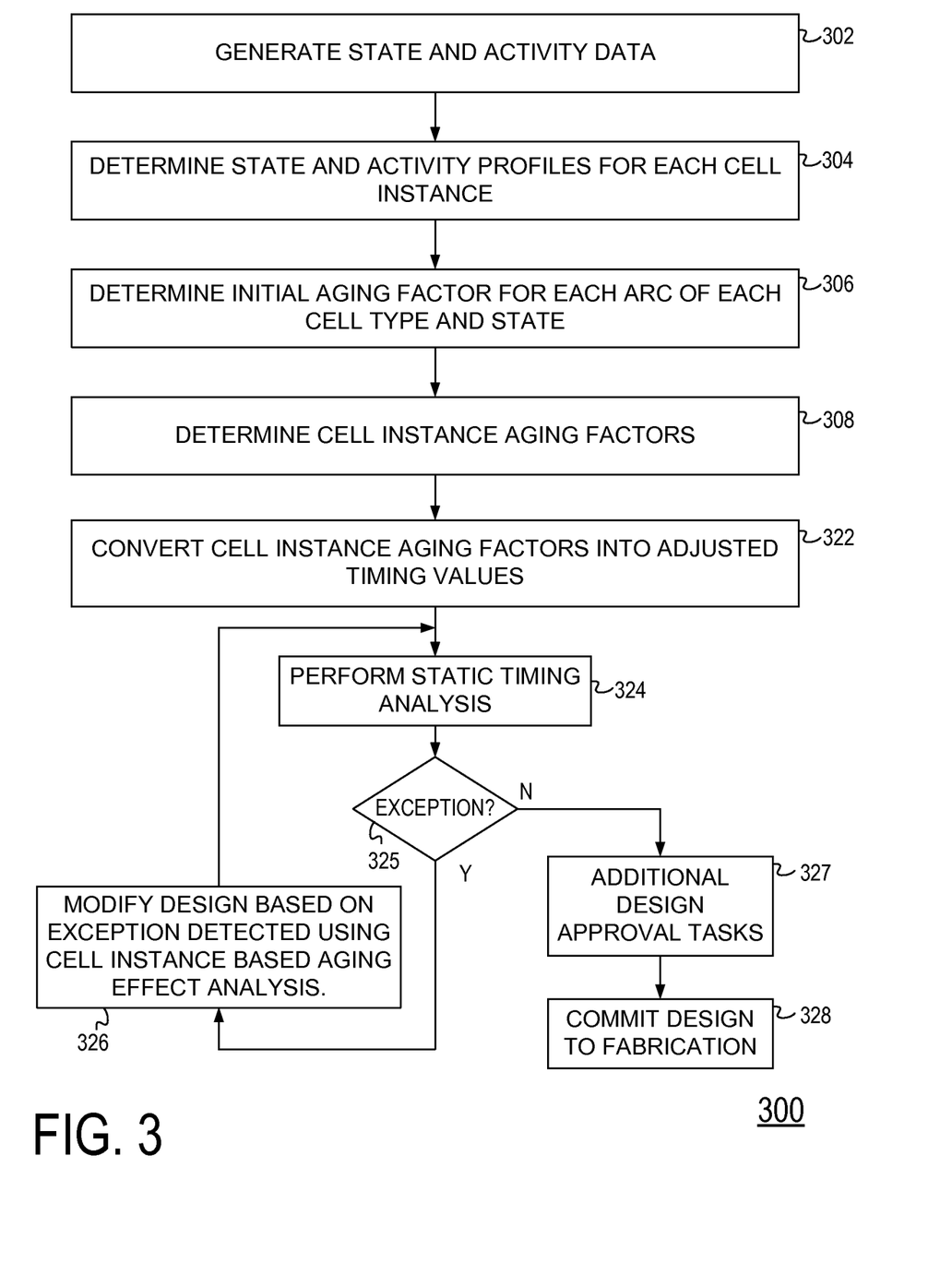
FIG. 3 is a flow diagram depicting selected elements of a second embodiment of a method of performing static timing analysis.

Referring now to FIG. 3, selected elements of a second embodiment of a method for performing static timing analysis is depicted. In the embodiment depicted in FIG. 3, method 300 includes the generation (block 302) of state/activity data. The state/activity data generated in block 302 preferably includes information that is specific with respect to each instance of a cell within a design. Moreover, because the data generated in block 302 encompasses activity data as well as state data, the data generated in block 302 may include switching data, i.e., data indicating state transitions from clock cycle to clock cycle for the cells of a given design.

It will be appreciated by those skilled in the field of integrated circuit design that state profile information as described with respect to FIG. 1 and the state/activity profile information described with respect to block 302 may include different information. Whereas state information conveys relative percentages of clock cycles that a cell spends in each of its available states, activity information emphasizes the frequency of state transitions. Two instances of a cell that exhibit similar state profile information may have dramatically different activity profile information. If, for example, a first instance of a cell spends a first half of a specified timing interval in a first state and spends a second half of the timing interval in a second state, the state profile information for this cell instance will reflect that the cell occupies the first and second states for approximately 50% of the clock cycles. The activity profile for this cell instance, however, will indicate very few state transitions. A second instance of the same standard cell may transition between the first state and the second state every clock cycle. While the state profile information for this instance of the cell will be similar to the state profile information of the first cell instance, the activity profile for the second instance of the cell will be dramatically different, i.e., dramatically increased from the first instance of the cell. While state profile information may be primarily determinative of certain aging effects such as NBTI and PBTI, HCI and other aging effect phenomena that correlate with the occurrence of spikes in energy fields and currents may be more influenced by activity data than state profile data per se.

In some embodiments, the generation of state/activity data in block 302 may be achieved by performing a power analysis simulation of the design. To facilitate the verification of an integrated circuit, a design team, a verification team, or both may specify a test vector that exercises a model of the design in a manner that is thought to be representative of the design's actual operation. The test vector that is simulated may attempt to simulate the amount of power that the device consumes over any given duration. Such a simulation may be referred to herein as a power analysis simulation because the simulation is primarily motivated to obtain an estimate of the amount of power the device consumes. Although power analysis simulation is not the only type of simulation that may be performed to generate the state/activity data indicated in block 302, any simulation used is preferably sufficiently short, but sufficiently complex as well, to ensure a representative activity profile without substantial time and expense associated with more thorough simulation.

The generation of state/activity data in block 302, as described previously, may be performed using a simulation tool that executes a suitable test vector. The test vector employed for purposes of static timing analysis timing adjustments is preferably sufficiently representative of actual operation to provide a meaningful state profile, but is substantially shorter than a test vector that might be required for functional verification of the design. The simulation tool may generate an output indicative of state/activity data. In these embodiments, the output of the simulation tool may be formatted to comply with a particular standard, protocol, or specification. The output may, in some embodiments, be a switching activity interchange format (SAIF) file or another format capable of conveying cycle-by-cycle state information.

The embodiment of method 300 depicted in FIG. 3 includes a determination (block 304) of state/activity profiles for each instance of a cell within a given design. The determination may be based on the state/activity data generated in block 302. In some implementations, the state/activity profile information may define or comply with a function, referred to herein as a probability state function. The probability state function indicates the probability that a cell instance occupies a particular state at any point in time. More formally, block 304 may include the determination of a probability state function, ProbState(J,s), where J identifies a cell instance, s indicates a particular cell state, and ProbState(J,s) indicates a probability that cell instance J is in cell state s.

After determining state/activity profiles for each cell instance, the depicted embodiment of method 300 includes calculating (block 306) aging factors for each arc-state pair in the design. In some embodiments, the operation represented by block 306 is analogous to the operation represented by block 102 in FIG. 1. However, whereas aging factors were determined in block 102 of FIG. 1 for each arc in each standard cell in a standard cell library, aging factors are determined in block 306 of FIG. 3 for the instances of standard cells occurring in the design.

After calculating instance-specific aging factors in block 306, the depicted embodiment of method 300 includes a determination (block 308) of cell instance aging factors for each cell instance in a design. The operation of FIG. 3, block 308 may be analogous to operation 105 depicted and described with respect to FIG. 1.

Method 300 as depicted in FIG. 3 further includes converting (block 322) the cell instance aging factors determined in block 308 into adjusted timing values. Conversion of aging factors to adjusted timing values may include accessing the previously described aging factor libraries and retrieving or extrapolating degradation delay values for a specified value of t and the aging factor determined in block 306.

After converting the instance-specific aging factors into adjusted timing values, method 300 enters an iterative loop in which a static timing analysis is executed (block 324) using modified timing values. In this context, date modified timing values refer to differences between static timing analysis values associated with a standard cell and the instance-specific adjustments to those static timing analysis values as described herein.

After performing a timing analysis in block 324, a determination is made (block 325) of whether the timing analysis raised any exceptions or otherwise indicated any failures of the design. If an exception is detected in block 325, the design may be further modified to address any exceptions raised. The modification of the design represented by block 326 may be primarily based on the exception detected in block 324. After modifying a design in block 326, method 300 as depicted returns to block 324 to perform a static timing analysis. In some embodiments, the modification of the design in block 326 may justify a subsequent iteration of determining the modified design model.

If, in block 325, no exceptions are detected following the execution of a timing analysis in block 324, the design is subjected to additional design approval tasks in block 327, which may include functional verification using simulation. Ultimately, when all design approval efforts have been satisfactorily completed, the design may be committed (block 328) to fabrication. In some embodiments, committing a design to fabrication may include: generating a tape out suitable for defining a set of masks used for photolithography, requesting, purchasing, or otherwise obtaining an actual mask set, and initiating a wafer start using mask sets determined as described herein. Thus, method 300 as depicted in FIG. 3 emphasizes, in addition to the determination of instance-specific aging factors and instance-specific static timing analysis adjustments, the use of these modified models in fabricating actual devices.

Embodiments of methods for making aging effect adjustments to timing models for static timing analysis described herein may be implemented as computer executable program instructions that, when executed by a processor in a computer or other type of data processing system, perform methods including the methods depicted in FIG. 1 and FIG. 3 above.

Figures 4, 5:
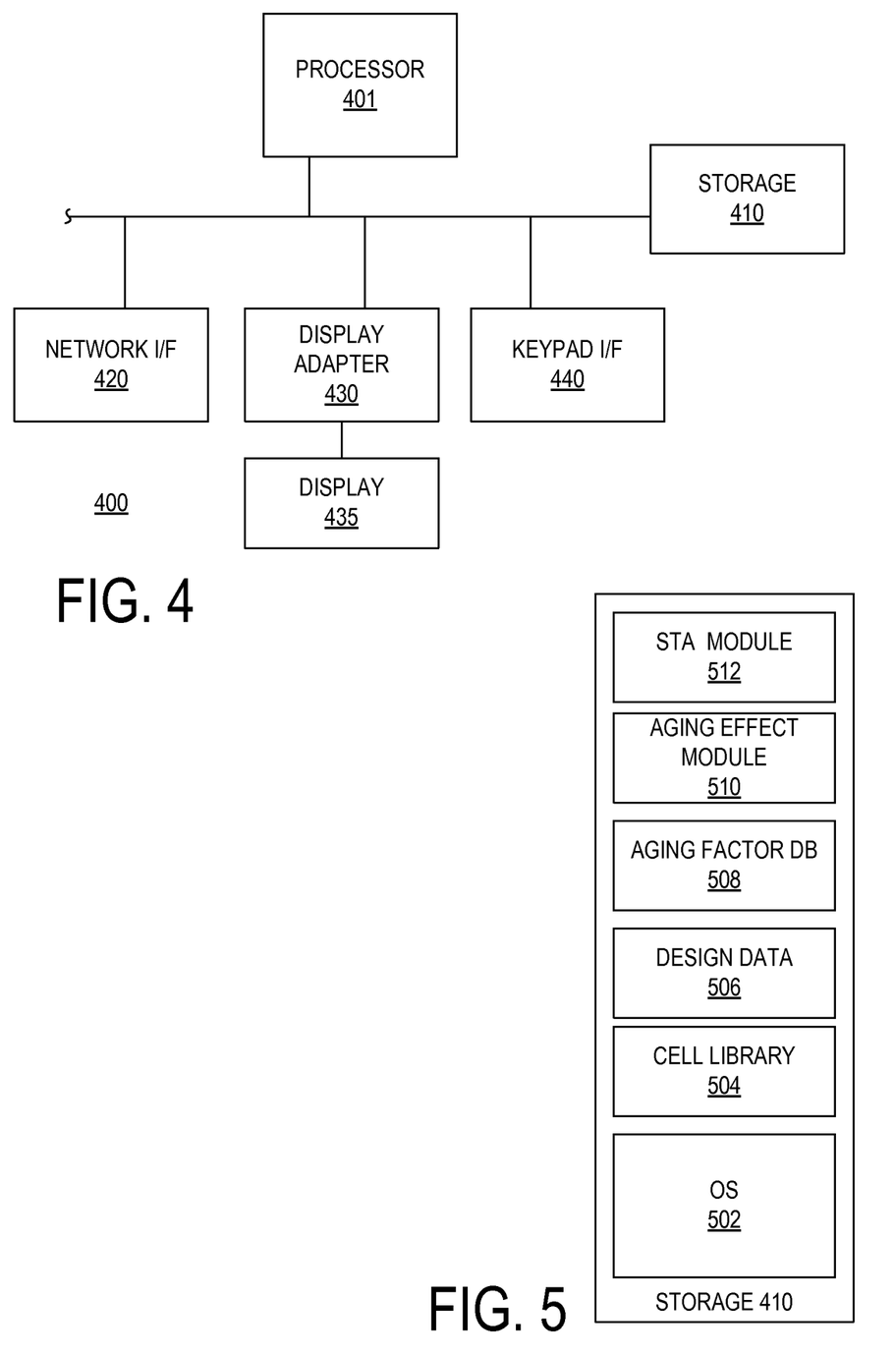
FIG. 4 is a block diagram depicting selected elements of an embodiment of a data processing system suitable for performing the static timing analysis methods of FIG. 1 and FIG. 3.
FIG. 5 is a block diagram depicting selected elements of a data storage medium suitable for use with the data processing system of FIG. 4.

Referring now to FIG. 4, selected elements of an embodiment of a data processing system 400 is depicted. Data processing system 400 is suitable for executing program instructions for performing the methods of FIG. 1 and FIG. 3. As depicted in FIG. 4, data processing system 400 may include a general purpose processor 401 connected and having access to a computer readable storage medium identified in FIG. 4 as storage 410. The depicted embodiment of data processing system 400 may further include a display adapter 430 connected to a display device 435 and input/output means including a keypad interface 440. The depicted embodiment of data processing system 400 further includes a network interface 420 enabling data processing system 400 to connect to and communicate with remote computer resources over a network, which may include an IP network. Data processing system 400 may be implemented as a server system in a client server architecture and may provide static timing analysis services generally or aging effect timing adjustments specifically.

Referring now to FIG. 5, selected elements of an implementation of storage device 410 of FIG. 4 are depicted. In some embodiments, disclosed subject matter is implemented as software or a set of instructions executable by a processor such as processor 401 (FIG. 4). In these embodiments, execution of certain instructions by processor 401 may result in the performance of one or more methods. The method(s) performed by processor 401 may be determined by instructions stored in storage 410. In the embodiment depicted in FIG. 5, storage 410 stores various data structures and software modules such as an operating system 502, standard cell library 504, design data 506, aging factor database 508 containing one or more aging factor libraries, aging effect module 510 and static timing analysis module 512.

Operating system 502 may include all or some portion of the program instructions necessary for processor 401 and data processing system 400 to execute application programs including the programs depicted in FIG. 5. standard cell library 504 may include models for a variety of standard cell types, each of which may include multiple functionally similar cells. Design data 506 includes data defining the cell instances and other elements of the applicable device and how they are interconnected. Aging factor database 508 includes data indicating various aging effect symptoms, including degradation of an arc's delay, as a function of time. Aging effect module 510 represents the module that performs the instance-specific aging factor determinations and the instance-specific adjustment of timing values used by a static timing analysis module. Static timing analysis module 512 may include a data structure storing or otherwise containing timing models for the cells in the standard cell library. Static timing analysis module 512 may further include a static timing analysis engine for performing static timing analysis.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method for performing static timing analysis of a design of an integrated circuit, the method comprising:
   determining, by a computer, aging factors for arcs in standard cells in a standard cell library comprising a plurality of cells, wherein an arc represents a path from a specified input of a specified cell to a specified output of the specified cell;
   determining state profiles for cell instances in the design, wherein a cell instance represents an instantiation of a standard cell within the design and wherein a state profile for the cell instance indicates instance-specific probabilities for possible states that the standard cell may occupy;
   determining, from the state profiles and the aging factors, an instance-specific aging factor for each of the cell instances;
   converting the instance-specific aging factors into instance-specific aging effect timing values wherein converting the instance-specific aging factors into instance-specific aging effect timing values includes interpolating at least one instance-specific aging effect timing value from a predetermined aging effect timing value; and
   based on the instance-specific aging effect timing values, generating instance-specific static timing models, suitable for use in performing static timing analysis, for each of the cell instances.

2. The method of claim 1, further comprising performing a static timing analysis of the design, based on the instance-specific timing models.

3. The method of claim 2, further comprising, responsive to an exception raised by the static timing analysis, modifying the design.

4. The method of claim 2, further comprising, after the static timing analysis generates no exceptions, performing functional verification on the design.

5. The method of claim 1, wherein determining state profiles includes performing a power analysis simulation of the device to generate a simulation output indicative of profile data.

6. The method of claim 1, wherein determining the instance-specific aging factors includes weighting the aging factors based on a state probability.

7. The method of claim 1, wherein the aging factors constitute nominal aging factors and the instance-specific aging effect timing values constitute nominal instance-specific aging effect timing values, the method further comprising:
   determining variational aging factors for the arc/states;
   determining instance-specific variational aging factors;
   converting the instance-specific variational aging factors into instance-specific variational aging effect timing values; and
   based on the instance-specific variational aging effect timing values and the instance-specific nominal aging effect timing values, generating instance-specific static timing models, suitable for use in performing static timing analysis, for each of the cell instances.

8. The method of claim 1, wherein determining the aging factors includes characterizing transistor level models of each standard cell.

9. The method of claim 1, wherein the interpolating comprises non-linear interpolation.

10. A non-transitory computer readable medium storing processor-executable program instructions that, when executed by a processor, perform a method for static timing analysis of a design of an integrated circuit, the method comprising:
    determining aging factors for arcs in standard cells in a standard cell library comprising a plurality of cells, wherein an arc represents a path from a specified input of a specified cell to a specified output of the specified cell;
    determining state profiles for cell instances in the design, wherein a cell instance represents an instantiation of a standard cell within the design and wherein a state profile for the cell instance indicates instance-specific probabilities for possible states that the standard cell may occupy;
    determining, from the state profiles and the aging factors, an instance-specific aging factor for each of the cell instances;
    converting the instance-specific aging factors into instance-specific aging effect timing values wherein converting the instance-specific aging factors into instance-specific aging effect timing values includes interpolating at least one instance-specific aging effect timing value from a predetermined aging effect timing value; and
    based on the instance-specific aging effect timing values, generating instance-specific static timing models, suitable for use in performing static timing analysis, for each of the cell instances.

11. The computer readable medium of claim 10, the method further comprising performing a static timing analysis of the design, based on the instance-specific timing models.

12. The computer readable medium of claim 11, wherein determining the aging factors includes accessing aging factor data from a plurality of aging factor libraries, wherein each aging factor library corresponds to a different value of time.

13. The computer readable medium of claim 12, wherein determining the aging factors further includes determining aging factor constants k and n in the equation Delta=$kt^n$, where Delta corresponds to timing degradation and t indicates time.

14. The computer readable medium of claim 10, wherein determining state profiles includes performing a power analysis simulation of the device to generate a simulation output indicative of profile data.

15. The computer readable medium of claim 10, wherein determining the instance-specific aging factors includes weighting the aging factors based on a state probability.

16. The computer readable medium of claim 10, wherein the aging factors constitute nominal aging factors and the instance-specific aging effect timing values constitute nominal instance-specific aging effect timing values, the method further comprising:
    determining variational aging factors for the arc/states;
    determining instance-specific variational aging factors;
    converting the instance-specific variational aging factors into instance-specific variational aging effect timing values; and
    based on the instance-specific variational aging effect timing values and the instance-specific nominal aging effect timing values, generating instance-specific static timing models, suitable for use in performing static timing analysis, for each of the cell instances.

17. The computer readable medium of claim 10, wherein determining the aging factors includes characterizing transistor level models of each standard cell.

18. The computer readable medium of claim 10, wherein converting the instance-specific aging factors into instance-specific aging effect timing values includes interpolating at least one instance-specific aging effect timing value from a predetermined aging effect timing value.

19. A data processing system, comprising:
a processor;
computer readable storage, accessible to the processor, storing processor-executable program instructions that, when executed by a processor, perform a method for static timing analysis of a design of an integrated circuit, the method comprising:
  determining aging factors for arcs in standard cells in a standard cell library comprising a plurality of cells, wherein an arc represents a path from a specified input of a specified cell to a specified output of the specified cell;
  determining state profiles for cell instances in the design, wherein a cell instance represents an instantiation of a standard cell within the design and wherein a state profile for the cell instance indicates instance-specific probabilities for possible states that the standard cell may occupy;
  determining, from the state profiles and the aging factors, an instance-specific aging factor for each of the cell instances;
  converting the instance-specific aging factors into instance-specific aging effect timing values wherein converting the instance-specific aging factors into instance-specific aging effect timing values includes interpolating at least one instance-specific aging effect timing value from a predetermined aging effect timing value; and
  based on the instance-specific aging effect timing values, generating instance-specific static timing models, suitable for use in performing static timing analysis, for each of the cell instances.

\* \* \* \* \*